United States Patent [19]

Sarath

[11] Patent Number: 4,860,163

[45] Date of Patent: Aug. 22, 1989

[54] COMMUNICATION EQUIPMENT CABINET COOLING ARRANGEMENT

[75] Inventor: Alan Sarath, Teaneck, N.J.

[73] Assignees: American Telephone and Telegraph Company, New York, N.Y.; AT&T Bell Laboratories, Murray Hill, N.J.

[21] Appl. No.: 229,076

[22] Filed: Aug. 5, 1988

[51] Int. Cl.⁴ ............................................. H05K 7/20
[52] U.S. Cl. .................................. 361/384; 361/391; 361/415
[58] Field of Search ............................ 174/15 R, 16 R; 361/381, 383, 384, 390, 391; 165/104.33

[56] References Cited

U.S. PATENT DOCUMENTS

| | | | |
|---|---|---|---|
| 3,123,743 | 3/1964 | Perlmutter | 317/100 |
| 3,364,838 | 1/1968 | Bradley | 98/33 |
| 3,526,458 | 9/1970 | Meyers et al. | 355/45 |
| 3,889,487 | 6/1975 | Frankfurt | 62/99 |
| 3,967,874 | 6/1976 | Calabro | 361/384 |
| 4,006,388 | 2/1977 | Bartholomew | 317/100 |
| 4,106,076 | 8/1978 | Miller et al. | 361/394 |
| 4,261,519 | 4/1981 | Ester | 239/548 |
| 4,500,944 | 2/1985 | Roberts et al. | 361/384 |
| 4,672,509 | 6/1987 | Speraw | 361/384 |

Primary Examiner—A. D. Pellinen
Assistant Examiner—Gregory D. Thompson
Attorney, Agent, or Firm—Frederick B. Luludis

[57] ABSTRACT

In order to cool heat generating components mounted on circuit packs plugged into a backplane wiring board mounted in a compact cabinet, in which the backplane would normally prevent a stream of cooling gas entering the front of the cabinet from flowing evenly over the heat generating components, a flow control baffle is placed on each side of the backplane to direct cooling gas entering the cabinet to the rear of the circuit packs and then around the backplane to a plenum formed by the backplane and a rear surface of the cabinet where the gas is exhausted by a fan. The exhaust of the cooling gas by the fan causes the level of the cooling gas pressure in the plenum to decrease, thereby urging additional cooling gas to enter the cabinet through louvers formed in the front surface of the cabinet.

15 Claims, 3 Drawing Sheets

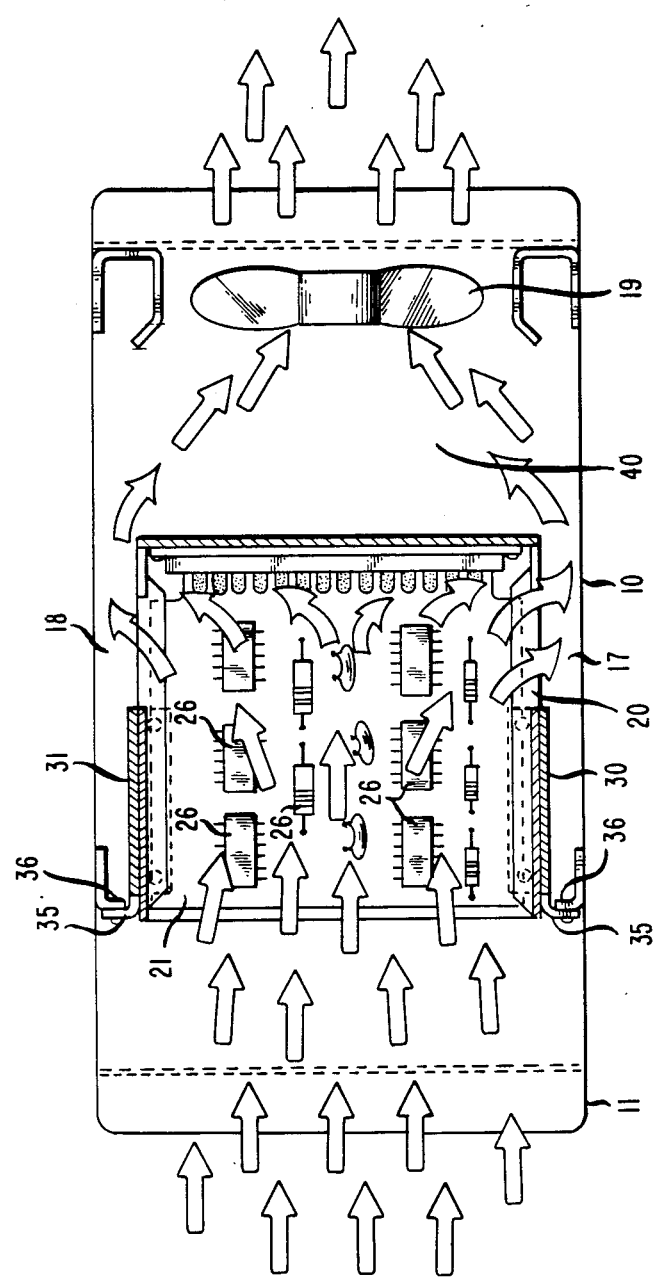

COMMUNICATION EQUIPMENT CABINET COOLING ARRANGEMENT

TECHNICAL FIELD

The invention relates to an arrangement for cooling an electronic assembly of heat generating components mounted in an equipment cabinet.

BACKGROUND OF THE INVENTION

In conventional cooling arrangements, in which circuit packs are edge mounted in a circuit pack cage and plugged into a so-called backplane wiring board attached to the cage, a cooling gas enters the bottom of the cabinet, rises vertically and passes over the heat generating components mounted on the circuit packs and then exits via louvers formed in the top surface of the cabinet. The vertical flow of the cooling gas is augmented by a forced convection system, such as a blower fan placed at the bottom of the cabinet or just beneath the circuit packs. Although such cooling arrangements are adequate, they are still faulty in some notable respects. For exmaple, when a blower fan is placed in proximity to the circuit packs, the flow of the cooling gas forms a vortex, thereby causing uneven cooling of the heat generating components. In addition, when the circuit packs are of different lengths, pockets of cooling gas formed by face plates attached to one end of the longer circuit packs prevent the cooling gas from flowing evenly over components mounted at the front of the circuit packs.

Alternatively, the circuit pack cage could be rotated 90 degrees so that it is mounted vertically in the cabinet. The cooling gas could then enter one side of the cabinet, flow over the heat generating components and exit via the opposite side of the cabinet. However, such a cooling arrangement would be ineffective in the instance where it is contemplated that at least two such cabinets will be placed side-by-side, since one cabinet would exhaust heated cooling gas into the next adjacent cabinet. With the circuit pack cage so oriented, the cooling gas could be arranged, on the other hand, so that it enters the front surface of the cabinet, flows over the heat generating components and then exits via the rear surface of the cabinet. However, in this instance, the backplane would impede the flow of the cooling gas causing it to form a turbulence within the cabinet.

SUMMARY OF THE INVENTION

In order to cool heat generating components mounted on circuit packs plugged into a backplane wiring board attached to the rear surface of a circuit pack cage disposed in a compact cabinet, in which the backplane would normally prevent a stream of cooling gas entering the front of the cabinet from flowing evenly over the heat generating components, a flow control baffle is placed on each side of the circuit pack cage to direct cooling gas entering the front of the cabinet to the rear of the circuit packs and thence around the backplane to a plenum formed by the backplane and a rear surface of the cabinet where the gas is exhausted by convection. The convection is obtained using, for example, a blower fan. The exhaustion of the cooling gas causes the level of the cooling gas pressure in the plenum to decrease, thereby urging additional cooling gas to enter the cabinet through louvers formed in the front surface of the cabinet.

BRIEF DESCRIPTION OF THE DRAWING

The features and advantages of the instant invention will be fully appreciated by reference to the following detailed description, when read in light of the accompanying drawing in which:

FIG. 3 is a cut-away top plan view of the apparatus depicted in FIG. 2.

DETAILED DESCRIPTION

Figure 1:
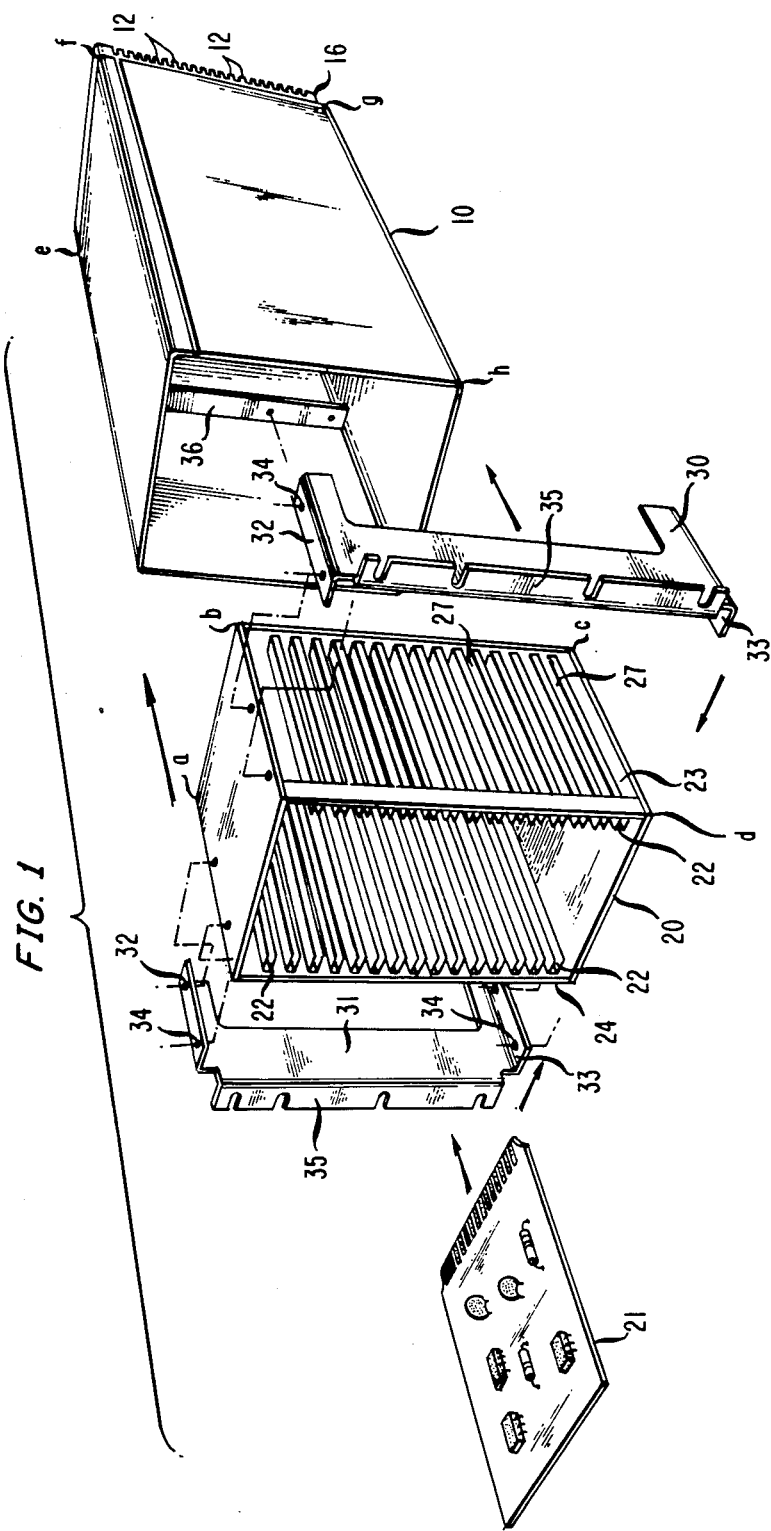
FIG. 1 is an exploded, front perspective view of apparatus which is the subject of the present invention.

Referring now to FIG. 1, there is shown flow control baffles 30 and 31 about to be attached to respective side surfaces 23 and 24 of circuit pack cage 20. Specifically, the end portions of baffles 30 and 31 are bent perpendicular away from the main body thereof to form top and bottom flange members 32 and 33. Baffles 30 and 31, which are mirror images of each other, are attached to circuit pack cage 20 by passing threaded bolts (not shown) through holes 34 formed in top and bottom flange members 32 and 33, respectively, and thence into corresponding holes (not shown) formed in the top and bottom surfaces of circuit pack cage 20. Once baffles 30 and 31 are so attached they are secured to circuit pack cage 20 by threading a nut having interior threads formed therein onto each bolt.

In addition, the front end of each baffle 30 and 31 is bent perpendicular to the main body thereof in a direction opposite to that of flange members 32 and 33 to form a front flange 35. Front flanges 35 attach to respective flanges 36 mounted in the interior of cabinet 10 to secure circuit pack cage 20 to the latter, as will be shown below.

Circuit pack cage 20, which may be, for example, the 84 HP Sub-Rack available from BICC-VERO Electronics Inc. of Trumbull, CT., includes a plurality of circuit pack guides collectively designated 22 for receiving respective circuit packs, such as circuit pack 21. The height and width of circuit pack cage 20 are illustratively 17.0 inches as measured from point "b" to point "c" and 10.5 inches as measured from point "a" to point "b", respectively. The depth of circuit pack cage 20 is illustratively 7.0 inches as measured from point "c" to point "d".

Circuit pack cage 10 also includes a so-called backplane wiring board (not shown in FIG. 1) affixed to a rear surface of circuit pack cage 20. The backplane wiring board could be, for example, the J1 VME bus backplane also available from BICC-VERO Electronics Inc.

Communication equipment cabinet, or housing, 10 includes a front door 11 (not shown in FIG. 1) and a rear door 16 each having a number of louvers 12 formed therein. Rear door 16 provides access to the back-plane wiring board when circuit pack cage 20 is mounted in cabinet 10. The height and width of cabinet 10 are illustratively 27.3 inches as measured from point "f" to point "g" and 12.8 inches as measured from point "e" to point "f", respectively, thereby making the height and width of cabinet 10 respectively 10.3 inches and 2.3 inches greater than that of circuit pack cage 20. The depth of cabinet 10, which is shown slightly exaggerated in the FIGs., is illustratively 21.5 inches as measured from point "h" to point "g".

Figure 2:
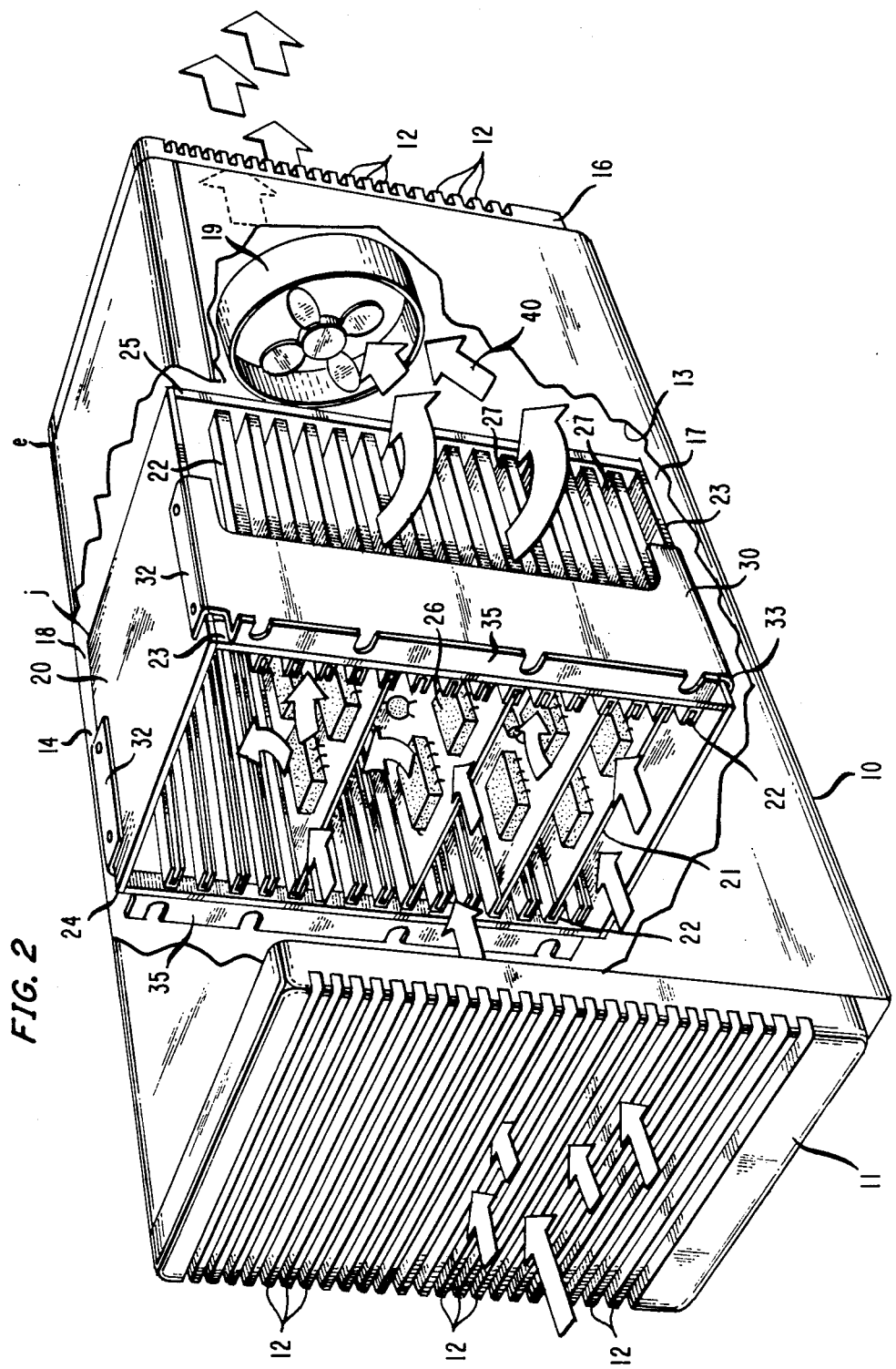
FIG. 2 is a cut-away, front perspective view of the apparatus shown in FIG. 1 assembled in accordance with the principles of the present invention.

Referring now to FIG. 2, there is illustrated a cutaway view of communication equipment cabinet 10 having circuit pack cage 20 inserted therein. The depth of cabinet 10 is shown slightly exaggerated,in the FIG. to clearly depict the manner in which circuit pack cage 20 is disposed therein, and to clearly depict the manner in which circuits packs 21 are mounted in respective circuit pack guides 22 formed in the interior of circuit pack cage 10. Each of the circuit packs 21 are shown having a number of heat generating components 26 affixed thereto. It is seen from the FIG. that circuit packs 21 are not mounted on edge as would be the case in conventional arrangements, but are mounted horizontally commensurate with the orientation of circuit pack cage 20 within cabinet 10. Access to circuit pack cage 20 when it is mounted in cabinet 10 is provided by front door 11 having a plurality of louvers 12 formed therein.

As mentioned above, the width of cabinet 10 is approximately 2.3 inches greater than the width of circuit pack cage 20. Thus, when circuit pack cage 20 is disposed in cabinet 10, a duct 17 is established between the right-hand side 23 of circuit pack cage 20 and right-hand interior surface 13 of cabinet 10. A similar duct 18 is also established between the left-hand side 24 of circuit pack cage 20 and left-hand interior surface 14 of cabinet 10. Ducts 17 and 18 communicate with plenum 40 formed by conventional backplane wiring board 25 attached to circuit pack cage 20 and rear door 16 of cabinet 10. The depth of plenum 40 as measured from point "j" to point "e" is illustratively 11 inches. The height and width of plenum 40 are substantially commensurate with that of cabinet 10.

The plurality of louvers 12 formed in front door 11 of cabinet 10 allow a stream of cooling gas, for example, air, to enter cabinet 10 and flow ovre and cool the heat generating components 26. In accordance with the invention, flow control baffles 30 and 31 attached to respective sides 23 and 24 of circuit pack cage 20 direct the flow of the cooling gas to heat generating components 26 affixed to the rear of circuit packs 21. The stream of cooling gas then exits circuit pack cage 20 via spaces 27 formed between adjacent circuit pack guides 22 and flows into ducts 17 and 18. The stream of cooling gas flowing into ducts 17 and 18 is then directed to plenum 40 where it is exhausted by the forced convection provided by blower fan 19 mounted in proximity to rear door 16. The cooling gas flows into plenum 40 by virtue of the negative pressure differential that exists between plenum 40 and front door 11 of cabinet 40. This negative pressure differential is created as a result of the cooling gas being exhausted by blower fan 19. The negative pressure differential thus urges the stream of gas to flow into plenum 40.

(It is noted that what is meant herein by the term "the rear of a circuit pack 21" is that end of a circuit pack having a connector (not shown) affixed thereto which plugs into a respective connector (not shown) affixed to back-plane wiring board 25. The term "the front of a circuit pack 21" is, of course, understood to mean the opposite end of the circuit pack).

The improvement occasioned by the arrangement of FIG. 2 can be appreciated by reference to FIG. 3. FIG. 3 illustrates a top cut-away view of the arrangement of FIG. 2, in which like elements retain the same designations. As can be seen, a stream of cooling gas as represented by the direction of the arrows depicted in FIG. 3 enters cabinet 10 via louvers 12 (not shown in FIG. 3) formed in front door 11. Front flange members 35 shown attached to respective flange members 36 of cabinet 10 then direct the flow of the cooling gas into circuit pack cage 20. Flow control baffles 30 and 31 then direct the flow of cooling gas over the heat generating components and thence into ducts 17 and 18. Once in ducts 17 and 18, the stream of cooling gas then flows into plenum 40 where it is exhausted by blower fan 19, as discussed above.

It can thus be appreciated that in the absence of baffles 30 and 31 the cooling gas flowing into circuit pack cage 10 would immediately flow into ducts 17 and 18 via spaces 27. As such, the stream of cooling gas would cool only those heat generating components 26 affixed generally at the front end of circuit packs 21 and would not reach the heat generating components affixed generally at the opposite end. As seen from FIG. 3, the aforementioned flow control problem is corrected by the presence of flow control baffles 30 and 31, ducts 17 and 18 and plenum 40.

It is also seen from FIG. 3, that front flange members 35 of baffles 30 and 31 when attached to respective flanges 36 not only serve to secure circuit pack cage 20 in cabinet 10, but also serve to direct the flow of the cooling gas entering through louvers 12 of front door 11 into circuit pack cage 20. Thus, front flange members prevent the cooling gas from immediately entering ducts 17 and 18, respectively. In this respect, front flange members 35 may be considered as being front flow-control baffles.

As mentioned above, the height of cabinet 10 is approximately 10.3 inches "greater" than that of circuit pack cage 20. Accordingly, circuit pack cage 20 may be disposed in cabinet 10 such that sufficient space is made available beneath circuit pack cage 20 for the location of electronic devices. The electronic devices could be, for example, disc drives and/or one or more power supplies for providing power to circuit packs 21 via backplane wiring board 25. It is well-known and understood that such electronic devices also need to be cooled and, therefore, are typically equipped with their own blower fans. To prevent those blower fans from interfering with the flow of the cooling gas over circuit packs 21, a baffle (not shown) is disposed in door 11 such that it cover the louvers 12 that are directly in front of the electronic devices when door 11 is in a closed position. In addition, a louver (not shown) is provided in a bottom surface of door 11 to allow a cooling gas to enter thereat and cool the electronic devices.

Various modifications and adaptations of the present invention will be apparent to those skilled in the art, and, for that reason, it is intended that the invention be limited only by the scope of the appended claims.

I claim:
1. Apparatus comprising
   a cabinet,
   a circuit pack cage disposed in said cabinet such that a plenum is formed between a rear surface of said circuit pack cage and an interior rear surface of said cabinet and a pair of ducts each communicating with said plenum are formed between respective side surfaces of said circuit pack cage and respective interior surfaces of said cabinet,
   means contained in said circuit pack cage for mounting an array of circuit packs each bearing heat generating components, said circuit packs being mounted one above the other such that the compo- nent mounting surface of each of said circuit packs is parallel with a top surface of said cabinet, and a pair of flow control baffles attached to respective side surfaces of said circuit pack cage, whereby a cooling gas which enters a front surface of said cabinet and flows over heat generating components affixed at one end of each of said circuit packs is directed by said pair of baffles to flow over heat generating components affixed at the other end of each of said circuit packs and thence into said ducts where said cooling gas then flows into said plenum and is exhausted therefrom.

2. The apparatus set forth in claim 1 wherein each of said baffles includes a front flange which attaches to a corresponding flange mounted in the interior of said cabinet so that said circuit pack cage may be positioned in said cabinet.

3. The apparatus set forth in claim 1 wherein said rear surface of said circuit pack cage is a backplane wiring board for receiving said circuit packs.

4. The apparatus set forth in claim 1 wherein said cabinet includes front and rear doors each having a plurality of louvers formed therein and a blower fan mounted in said rear door for providing a source of forced convection for the exhaustion of said cooling gas from said plenum.

5. The apparatus set forth in claim 2 wherein said front flange of each of said baffles constitutes a front baffle for directing the flow of said cooling gas entering said cabinet into said circuit pack cage.

6. Apparatus comprising a cabinet, means for receiving at least one assembly of heat bearing components, said means for receiving being disposed in said cabinet such that each side surface of said means for receiving and a respective interior surface of said cabinet form a duct communicating with a plenum formed by a rear surface of said means for receiving and an interior rear surface of said cabinet, means for urging a cooling gas to flow into said cabinet and thence over ones of said heat generating components disposed at one end of said assembly, and a pair of flow-control baffles attached to respective side surfaces of said means for receiving for directing the flow of said cooling gas over other ones of said heat bearing components disposed at the other end of said assemlby and thence into each said duct where said cooling gas flows into said plenum and is exhausted from said cabinet.

7. The apparatus set forth in claim 6 wherein each of said flow-control baffles includes a front flange which is attached to a corresponding flange mounted in the interior of said cabinet for positioning said means for receiving in said cabinet.

8. The apparatus set forth in claim 7 wherein said front flange of each of said flow-control baffles constitutes a front baffle for directing the flow of said cooling gas entering said cabinet into said means for receiving.

9. The apparatus set forth in claim 6 wherein said means for receiving is a circuit pack cage including a backplane wiring board for receiving said at least one assembly of heat generating components.

10. The apparatus set forth in claim 7 wherein said cabinet includes front and rear doors each having a plurality of louvers formed therein and wherein said means for urging is a blower fan mounted in proximity to said rear door for exhausting said cooling gas from said plenum.

11. Apparatus comprising a cabinet, a circuit pack cage for receiving at least one circuit pack bearing heat generating components, said circuit pack cage being disposed in said cabinet such that a duct communicating with a common plenum is formed on each side of said circuit pack cage, said at least one circuit pack being disposed in said circuit pack cage such that a plane defined by the surface of said at least one circuit pack is parallel with a top surface of said cabinet, means for urging a cooling gas to enter a front surface of said cabinet and to flow over ones of said heat generating components affixed at one end of said at least one circuit pack, and a pair of flow-control baffles attached to respective side surfaces of said circuit pack cage for directing the flow of said cooling gas to other ones of said heat generating components affixed at the other end of said at least one circuit pack and thence into each said duct so that said cooling gas may flow into said plenum responsive to a convection flow established by said means for urging.

12. The apparatus set forth in claim 11 wherein each of said flow-control baffles includes a front flange, said front flange being attached to a corresponding flange mounted in the interior of said cabinet to position said circuit pack cage in said cabinet.

13. The apparatus set forth in claim 12 wherein said front flange of each of said flow-control baffles constitutes a front baffle for directing the flow of said cooling gas into said circuit pack cage.

14. The apparatus set forth in claim 11 wherein said circuit pack cage includes a backplane wiring board for receiving said at least one circuit pack.

15. The apparatus set forth in claim 11 wherein said cabinet includes front and rear doors each having a plurality of louvers formed therein and wherein said means for urging is a blower fan mounted in said rear door.

* * * * *